US009538050B2

(12) United States Patent
Yoshida

(10) Patent No.: US 9,538,050 B2
(45) Date of Patent: Jan. 3, 2017

(54) METHOD AND APPARATUS FOR GENERATING JITTER-RELATED DATA

(71) Applicant: Leader Electronics Corp., Kanagawa (JP)

(72) Inventor: Kensuke Yoshida, Kanagawa (JP)

(73) Assignee: LEADER ELECTRONICS CORP., Kanagawa (JP)

( * ) Notice: Subject to any disclaimer, the term of this patent is extended or adjusted under 35 U.S.C. 154(b) by 90 days.

(21) Appl. No.: 14/140,422

(22) Filed: Dec. 24, 2013

(65) Prior Publication Data

US 2014/0184907 A1 Jul. 3, 2014

(30) Foreign Application Priority Data

Dec. 27, 2012 (JP) ................................ 2012-284561

(51) Int. Cl.
*H04N 5/21* (2006.01)
*H03L 7/00* (2006.01)
(Continued)

(52) U.S. Cl.
CPC *H04N 5/21* (2013.01); *H03L 7/00* (2013.01); *H04N 21/4342* (2013.01); *G01R 31/31709* (2013.01)

(58) Field of Classification Search
CPC .......... H04L 12/413; H04L 25/45; H04L 5/20; G01R 31/31709; H04B 1/707
(Continued)

(56) References Cited

U.S. PATENT DOCUMENTS 4,369,336 A * 1/1983 Agnello .......................... 381/61
5,555,030 A * 9/1996 Takamoto et al. ............ 348/642
(Continued)

FOREIGN PATENT DOCUMENTS

JP S54-099539 8/1979
JP S59-070332 4/1984
(Continued)

OTHER PUBLICATIONS

"Jitter Measurement Procedures in Bit-Serial Digital Interfaces," SMPTE Recommended Practice RP 192-2003, pp. 1-12 (Jul. 2003).
(Continued)

*Primary Examiner* — Michael Lee
(74) *Attorney, Agent, or Firm* — Klarquist Sparkman, LLP

(57) ABSTRACT

A jitter-associated data generator is provided for generating data associated with jitter. The jitter-associated data generator comprises a first circuit, a second circuit, and a third circuit. The first circuit generates an output including frequency components in a first frequency band common to first and second jitter, from a received digital input, as digital data associated with first jitter. The second circuit generates an output including frequency components in a second frequency band corresponding to the difference between the first and second jitter, from the received input, as differential digital data. The third circuit generates an output including frequency components in a third frequency band including the first and second frequency bands, from the received first jitter-associated digital data and differential digital data, as digital data associated with the second jitter.

8 Claims, 13 Drawing Sheets

(51) Int. Cl.
*H04N 21/434* (2011.01)
*G01R 31/317* (2006.01)

(58) Field of Classification Search
USPC .......................................................... 348/497
See application file for complete search history.

(56) References Cited

U.S. PATENT DOCUMENTS

| | | | | |
|---|---|---|---|---|
| 5,612,981 | A * | 3/1997 | Huizer | 375/376 |
| 5,754,437 | A * | 5/1998 | Blazo | 702/75 |
| 5,893,068 | A * | 4/1999 | Hasegawa | 704/502 |
| 6,426,846 | B1 * | 7/2002 | Chliwnyj et al. | 360/77.12 |
| 6,766,292 | B1 * | 7/2004 | Chandran et al. | 704/224 |
| 6,801,706 | B1 | 10/2004 | Jesuk | |
| 8,289,837 | B2 * | 10/2012 | Kim et al. | 370/210 |
| 2001/0050927 | A1 * | 12/2001 | Johnson | 370/535 |
| 2003/0202573 | A1 | 10/2003 | Yamaguchi et al. | |
| 2003/0223487 | A1 | 12/2003 | Fisher | |
| 2005/0232345 | A1 | 10/2005 | Ward et al. | |
| 2007/0041324 | A1 | 2/2007 | Shenoi | |
| 2008/0055008 | A1 * | 3/2008 | Staszewski et al. | 331/37 |
| 2009/0010656 | A1 * | 1/2009 | Futami et al. | 398/158 |
| 2010/0018383 | A1 * | 1/2010 | Thirumoorthy | 84/648 |
| 2010/0061435 | A1 | 3/2010 | Miles | |
| 2010/0094643 | A1 * | 4/2010 | Avendano et al. | 704/502 |
| 2012/0177383 | A1 * | 7/2012 | Tanimura et al. | 398/158 |
| 2013/0030726 | A1 * | 1/2013 | Thomas et al. | 702/56 |
| 2014/0139940 | A1 * | 5/2014 | Ong et al. | 360/39 |

FOREIGN PATENT DOCUMENTS

| | | |
|---|---|---|
| JP | S 60-28338 | 2/1985 |
| JP | 2001337120 | 12/2001 |
| JP | 2004-029013 | 1/2004 |
| WO | WO2007/027708 | 3/2007 |

OTHER PUBLICATIONS

"SDTV[1] Digital Signal/Data—Serial Digital Interface," SMPTE Standard SMPTE 259M-2008, pp. 1-18 (Jan. 2008).

"1.5 Gb/s Signal/Data Serial Interface," SMPTE Standard SMPTE ST 292-1:2012, pp. 1-21 (Jan. 2012).

"3 Gb/s Signal/Data Serial Interface," SMPTE Standard SMPTE 424M-2006, pp. 1-9 (Apr. 2006).

Examination Report from related Great Britain Application No. 1322846.5, dated Jun. 15, 2015, 3 pages.

Notice of Reason for Rejection from Japanese Patent Application No. 2012-284561, dated Sep. 13, 2016, 5 pages (with English translation).

Search Report from Great Britain Application No. GB1322846.5, dated Jun. 25, 2014, 4 pages.

* cited by examiner

EYE PATTERN DATA GENERATOR
300
SDI SIGNAL
302
CLOCK EXTRACTOR /DIVIDER
DIVIDED CLOCK
304
PLL CIRCUIT
SAMPLING CLOCK
306
SAMPLING CIRCUIT
308
JITTER DETECTOR CIRCUIT
JITTER DETECTION DATA
310
LOW-PASS FILTER
DIFFERENTIAL DIGITAL DATA
312
COMBINER CIRCUIT
EYE PATTERN DATA A
EYE PATTERN DATA T

METHOD AND APPARATUS FOR GENERATING JITTER-RELATED DATA

CROSS REFERENCE TO RELATED APPLICATIONS

This application claims priority from Japanese Patent application No. 2012-284561 entitled "Method and Apparatus for Generating Jitter-Related Data," filed on Dec. 27, 2012. The specification, drawings and claims of the application are incorporated herein by reference in their entirety.

TECHNICAL FIELD

Disclosed embodiments relate to a method and apparatus for generating jitter-associated data, and to a method and apparatus for generating eye-pattern data using the same.

For serial digital interface (SDI) signals for use in television systems, standards relating to jitter in signals are in existence, such as SMPTE 259M, SMPTE 292-1, SMPTE 424M, and others. Within these standards there are defined three bandwidths in which jitter should be observed, namely, bandwidths of 10 Hz or more, 1 kHz or more, and 100 kHz or more. To enable observation of jitter, SMPTE RP192 Standard proposes an eye-pattern based on an observation method. The eye-pattern based observation method observes jitter by measuring a width in a horizontal axis direction between intersections of rising edges and falling edges of signals found in an eye pattern. However, use of this eye-pattern jitter observation method is subject to difficulties in finding jitter from an eye pattern when jitter exists in an amount not less than 1 UI (unit interval). For observing jitter of 1 IU or more, SMPTE RP192 standard proposes a phase-demodulated jitter detector circuit.

Waveform monitor products for use with modern television systems are often equipped with both an eye-pattern display function and a phase-demodulation type jitter detection function to observe jitter contained in an SDI signal. In waveform monitor products, an eye pattern is employed not only for observing jitter but also for confirming whether values related to amplitude and slew rate of an SID signal satisfy standard values. For observing an SID signal to determine whether its waveform satisfies the standard, less jitter present on an eye pattern results in a higher accuracy of measurement and also higher reliability, so that an eye pattern of alignment jitter is employed more often for such observation than an eye pattern of timing jitter.

In this regard, the terms "jitter," "timing jitter," "alignment jitter," "UI," and the like are defined, for example, in SMPTE RP192 standard.

A conventional eye pattern based jitter observation circuit proposed by the aforementioned SMPTE RP192 Standard is equipped with a PLL circuit for alignment jitter and a PLL circuit for timing jitter. One of sampling clocks generated by these PLL circuits selectively is used to sample an SDI signal to generate eye pattern data for alignment jitter or eye pattern data for timing jitter.

However, the foregoing conventional circuit implies a variety of problems. A first problem results from a switched use of loop bandwidths for the PLL circuits. Specifically, when loop bandwidth settings are switched between that for alignment jitter observation and that for timing jitter observation, the PLL circuits become out of lock, causing a displayed eye pattern image to be disturbed. Additionally, the PLL circuit thus becoming out of lock does not allow automatic measurement of a quality of the eye pattern waveform to be continued. Furthermore, since a certain time is required for the PLL circuit to relock, a problem arises in that it takes time to again measure a quality of the eye pattern waveform.

Also, a second problem likewise results from use of switched use of loop bandwidths for the PLL circuits. Specifically, a conventional jitter observation circuit cannot simultaneously obtain eye pattern data for timing jitter and alignment jitter. When timing jitter is observed with an eye pattern while a quality of an SDI signal waveform is measured from this eye pattern, accuracy and reliability of the circuit may degrade. Accordingly, a problem can arise, for example, when timing jitter is observed with an eye pattern while an automatic measurement is employed to determine whether or not an SDI signal waveform satisfies criteria in a test or the like.

Further, in solving the second problem above a third problem can arise in a case that a sampling circuit as above and an analog-to-digital (AD) converter is provided in two sets, one for alignment jitter and the other for timing jitter. However, it is not economic, or preferable in view of suppression of variations in performance to employ two such circuits in handling a high-speed SDI signal.

SUMMARY OF INVENTION

While the following various aspects and embodiments will be described and explained in connection with apparatuses, circuits, and methods, they are meant to be exemplary and illustrative, and not limiting in scope. In various embodiments, one or more of the above-described problems have been reduced or eliminated, while other embodiments are directed to other improvements.

According to a first embodiment, a method of generating digital outputs associated with first jitter and second jitter comprises the steps of generating a first and a second digital output from a digital input, where the first digital output is associated with the first jitter, the first digital output includes frequency components in a first frequency band common to the first and second jitter, and the second digital output includes frequency components in a second frequency band corresponding to a difference between the first and second jitter; and generating a third digital output associated with the second jitter from the first digital output and the second digital output, where the third digital output includes frequency components in a third frequency band, and the third frequency band includes the first and second frequency bands.

According to another embodiment, a generator circuit is provided for generating digital outputs associated with first jitter and second jitter. The generator circuit comprises a first circuit that receives a digital input and generates a first digital output associated with the first jitter from the digital input, where the first digital output includes frequency components in a first frequency band common to the first and second jitter; a second circuit that receives the digital input, and generates a second digital output from the digital input, where the second digital output includes frequency components in a second frequency band corresponding to a difference between the first and second jitter; and a third circuit that generates a third digital output associated with the second jitter from the first digital output and the second digital output, where the third digital output includes frequency components in a third frequency band, and the third frequency band includes the first and second frequency bands.

According to a further embodiment, a method of combining frequency components in two frequency bands, comprises the steps of writing a first digital data including frequency components in a first frequency band into a memory, where a write address for the writing is generated from timing information associated with the first digital data; and reading the first digital data from the memory, where a read address for the reading is generated from second digital data including frequency components in a second frequency band and the write address, the digital data read from the memory includes frequency components in a third frequency band, and the third frequency band includes the first and second frequency band.

According to a yet further embodiment, a combiner circuit for combining frequency components in two frequency bands, comprises a memory; a write address generator circuit that generates, from timing information associated with the first digital data, a write address for writing first digital data including frequency components in a first frequency band into the memory; and a read address generator circuit that generates, from second digital data including frequency components in a second frequency band and the write address, a read address for reading the first digital data from the memory, where the digital data read from the memory includes frequency components in a third frequency band, and the third frequency band includes frequency components in the first and second frequency bands.

In addition to the exemplary aspects and embodiments described above, further aspects and embodiments will become apparent by reference to the drawings and by study of the following descriptions.

DESCRIPTION OF EMBODIMENTS

In the following, a variety of embodiments will be described in detail with reference to the accompanying drawings.

Figure 1:
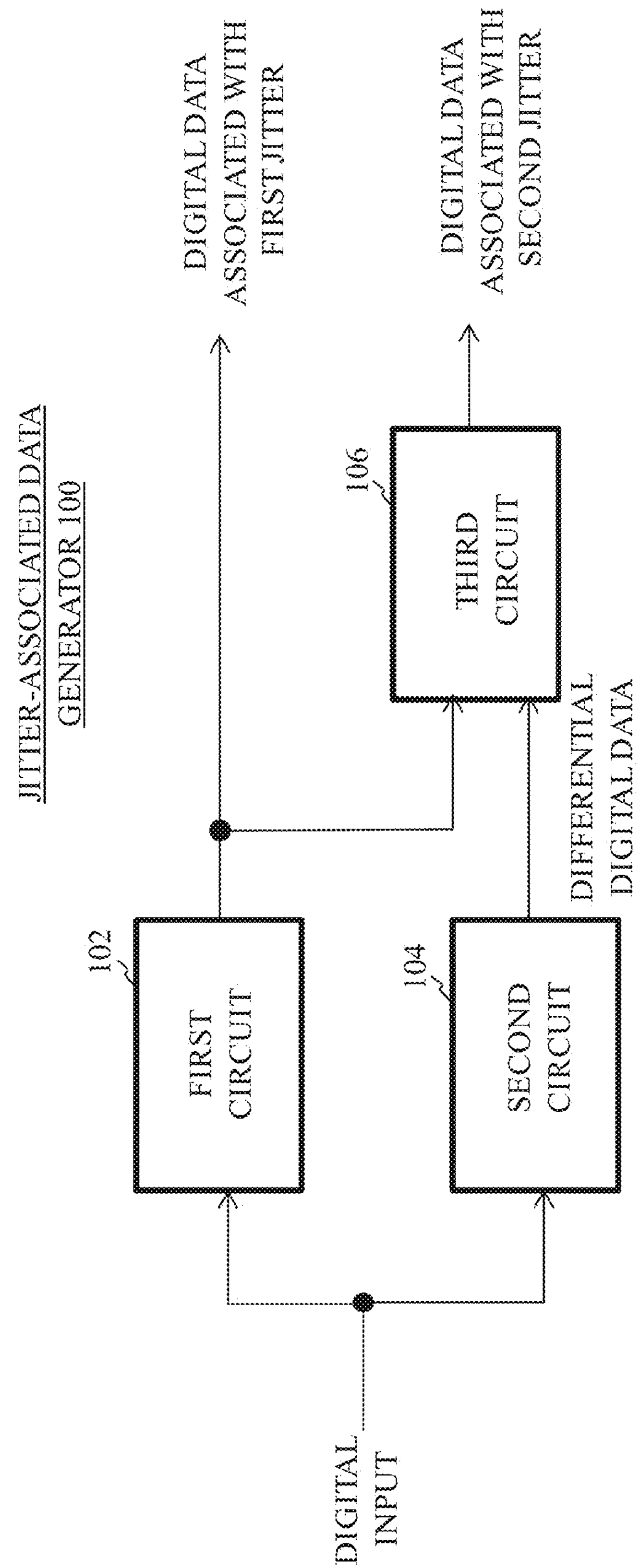
FIG. 1 is a block diagram showing a jitter-associated data generator according to a first embodiment.

FIG. 1 is a block diagram showing a jitter-associated data generator 100 according to a first embodiment. This jitter-associated data generator 100 receives a digital input signal, and generates digital data associated with two kinds of jitter associated with the digital input, i.e., first jitter and second jitter. The generator 100 comprises a first circuit 102, a second circuit 104, and a third circuit 106. First circuit 102 has an input terminal for receiving the digital input signal, and generates, from the digital input signal received at the input terminal, an output signal that includes frequency components in a first frequency band B1, which is common to the first and second jitter, and is output as digital data associated with the first jitter. Second circuit 104 likewise has an input terminal for receiving a digital input signal, and generates, from the digital input signal received at the input terminal, an output signal that includes frequency components in a second frequency band B2, which corresponds to a difference between the first and second jitter, and is output as differential digital data. Third circuit 106 has two input terminals connected to the output terminal of first circuit 102 and to the output terminal of second circuit 104, respectively, and generates, from the first jitter-associated digital data and the differential digital data received at these input terminals, an output signal that includes frequency components in a third frequency band B3, which includes the first and second frequency bands B1 and B2, and is output as digital data associated with the second jitter.

Figure 2:
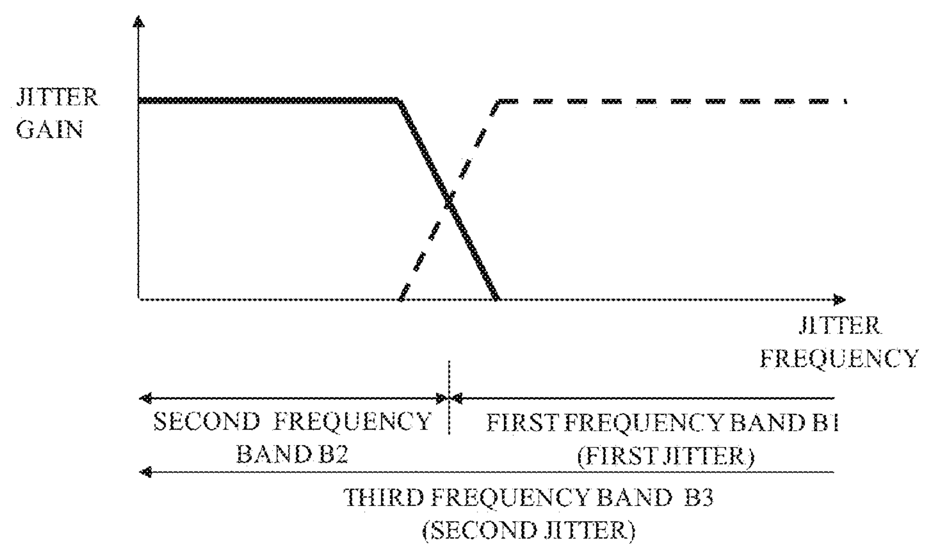
FIG. 2 is a diagram showing the relationship among a first, a second, and a third frequency band B1-B3.

FIG. 2 is a diagram showing a relationship among the three frequency bands, i.e., first-third frequency bands B1-B3. As illustrated, the first jitter relates to the first frequency band B1, the second jitter relates to the third frequency band B3, and the second frequency band B2 is provided as a differential band of the two. In the first embodiment, the first frequency band B1 and second frequency band B2 are combined to cover the third frequency band B3. As such, the jitter-associated data generator 100 does not generate the first and second jitter-associated digital data one by one, but simultaneously generates both jitter-associated digital data. Also, since the jitter-associated data generator 100 generates the second jitter-associated digital data from the first jitter-associated digital data, the jitter-associated data generator 100 need not be provided with a similar circuit to that for generating the first jitter-associated digital data for generation of the second jitter-associated digital data.

Figure 3:
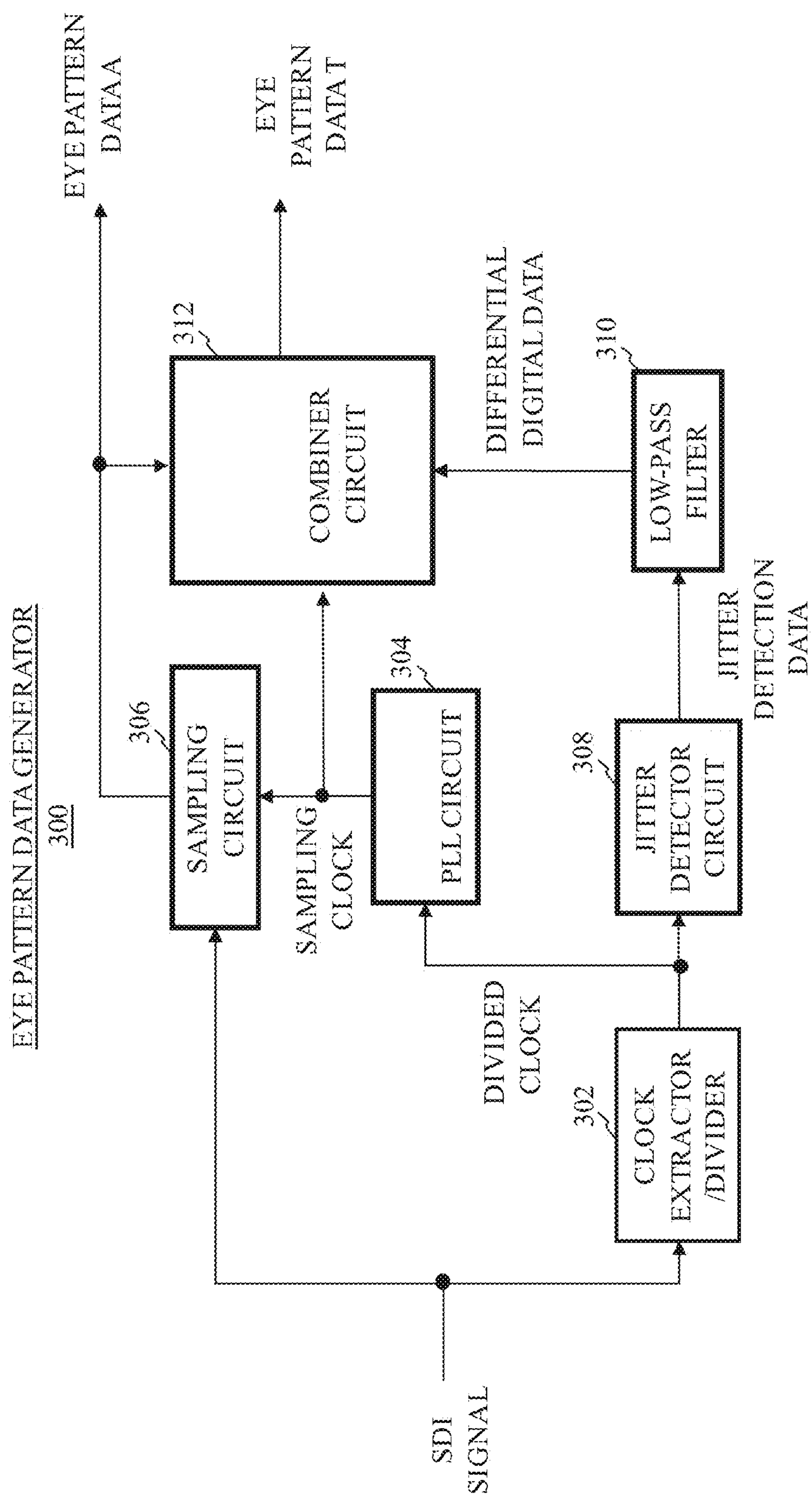
FIG. 3 is a block diagram showing an eye pattern data generator in one embodiment, which is a more specific version of the jitter-associated data generator shown in FIG. 1.

Referring next to FIG. 3, an eye pattern generator 300 will be described in one embodiment which is a more specific version of the jitter-associated data generator shown in FIG. 1. The generator 300 receives an SDI signal as an input, and generates, as outputs, eye pattern data A for displaying alignment jitter as an eye pattern and eye pattern data T for displaying timing jitter as an eye pattern. In this exemplary embodiment, the alignment jitter and timing jitter will be described in accordance with definitions made in Standard SMPTE 292-1. Table 1 below shows values related to the alignment jitter and timing jitter in different standards.

TABLE 1

Standard Values for Jitter

| | ALIGNMENT JITTER | TIMING JITTER |
|---|---|---|
| SMPTE 259M | ≥1 kHz, 0.2 UI or less | ≥10 Hz, 0.2 UI or less |
| SMPTE 292-1 | ≥100 kHz, 0.2 UI or less | ≥10 Hz, 1 UI or less |
| SMPTE 424M | ≥100 kHz, 0.3 UI or less | ≥10 Hz, 1 UI or less |

Describing first the generation of eye pattern data A, eye pattern data generator 300 comprises a clock extractor/divider circuit 302, a PLL circuit 304, a sampling circuit 306, a jitter detector circuit 308, a low-pass filter 310, and a combiner circuit 312. Clock extractor/divider circuit 302, PLL circuit 304, and sampling circuit 306 correspond to first circuit 102 in FIG. 1. Clock extractor/divider circuit 302, jitter detector circuit 308, and low-pass filter 310 correspond to second circuit 104 in FIG. 1. Combiner circuit 312 corresponds to third circuit 106 in FIG. 1.

Figure 4:
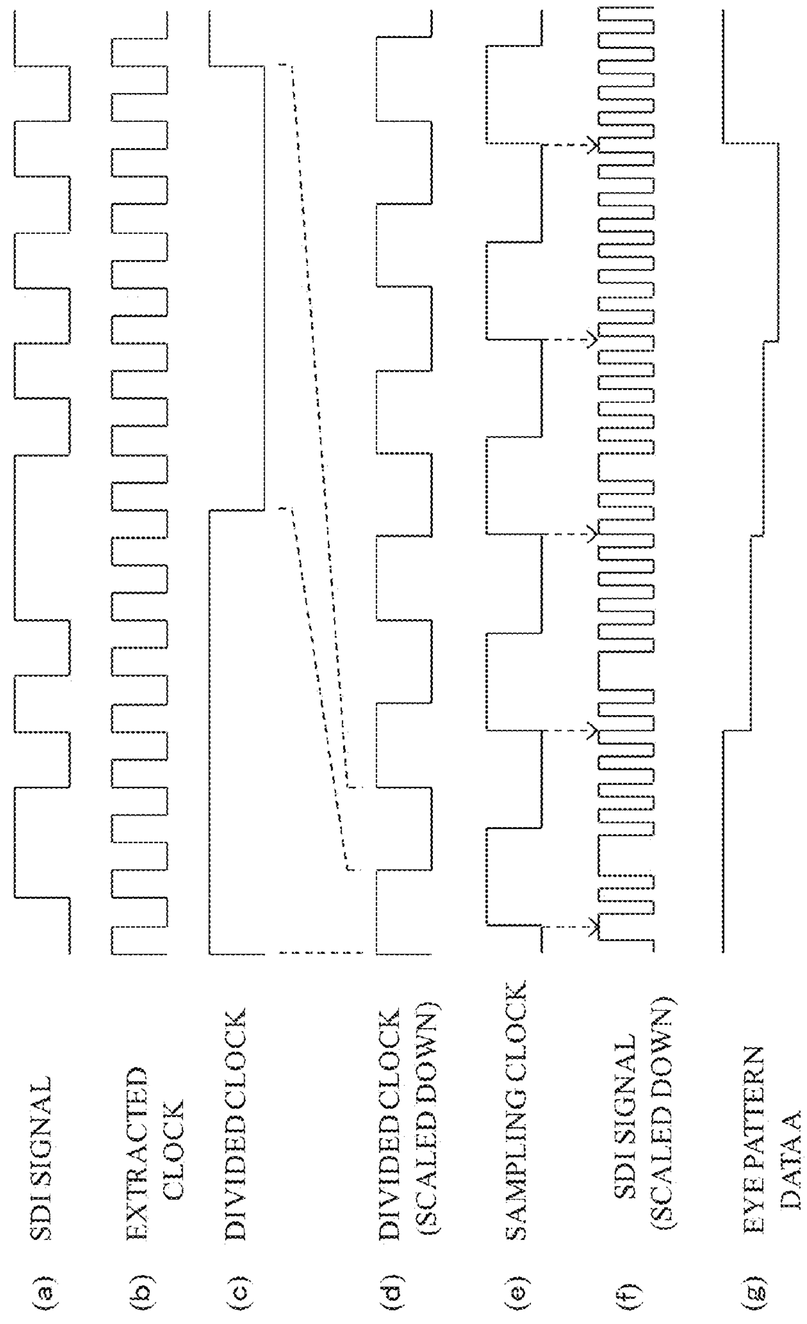
FIG. 4 is a timing diagram showing waveforms at various points in the eye pattern data generator of FIG. 3.

Described in greater detail with further reference to FIG. 4, clock extractor/divider circuit 302 has an input terminal for receiving an SDI signal (FIG. 4(*a*)), and extracts a clock (FIG. 4(*b*)) from the SDI signal received at this input terminal, divides the extracted clock, and generates the result as a divided clock (FIG. 4(*c*) or FIG. 4(*d*) in which a time axis is scaled down) at its output terminal. More specifically, clock extractor/divider circuit 302 may, for example, comprise an equalizer, a reclocker, and a divider. The equalizer reshapes the signal waveform of the input SDI signal to facilitate processing of the SDI signal at later stages. The following reclocker extracts a clock superimposed on the SDI signal, and the divider divides the extracted clock. Since the clock output from the reclocker ranges over a wide frequency band including 270 MHz, 1485 MHz, or 2970 MHz, the clock is reduced by the divider to a frequency suitable for processing at subsequent circuits. It is noted that the divided clock output includes jitter contained in the SDI signal.

The PLL circuit 304, which has an input terminal for receiving the divided clock, creates a sampling clock (FIG. 4(*e*)) for use in the sampling circuit 306 from the divided clock, and generates the sampling clock at its output terminal. The PLL circuit 304 has a loop band of 100 kHz or lower for detecting alignment jitter. Accordingly, in an eye pattern that displays alignment jitter, jitter components of 100 kHz or lower are canceled out by sampling with a sampling clock having a band of 100 kHz or lower, thus resulting in a reduced amount of observed jitter. More specifically, PLL circuit 304 may, for example, comprise a fractional N-PLL or the like, and be synchronized to the divided clock in phase, thereby to provide a sampling clock. One object of PLL circuit 304 is to create a sampling clock in which high-band components (100 kHz or higher) are cut from jitter contained in the divided clock (or SDI signal). Another object of PLL circuit 304 is to provide the sampling clock with a frequency for equivalent time sampling which may be implemented in sampling circuit 306.

Next, sampling circuit 306 has an input terminal for receiving the sampling clock (FIG. 4(*e*)) from PLL circuit 304, and an input terminal for receiving the SDI signal (FIG. 4(*f*) in which the waveform of the SDI signal (FIG. 4(*a*)) is shown with a scaled-down time axis). More specifically, sampling circuit 306 may, for example, comprise a track/hold circuit and an AD converter, and sample the SDI signal using the sampling clock, and output the resulting sampled data as eye pattern data A (FIG. 4(*g*)). The sampling scheme employed herein is the equivalent time sampling. Accordingly, when an SDI signal containing a entire band of jitter is sampled in accordance with the equivalent time sampling, with a sampling clock that contains only jitter in a low band lower than 100 kHz, which is a lower limit frequency of the frequency band for alignment jitter, those jitter components contained in the two signals are canceled out, so that eye pattern data A includes only frequency components in a frequency band of 100 kHz or higher, which corresponds to the alignment jitter.

Figure 5:
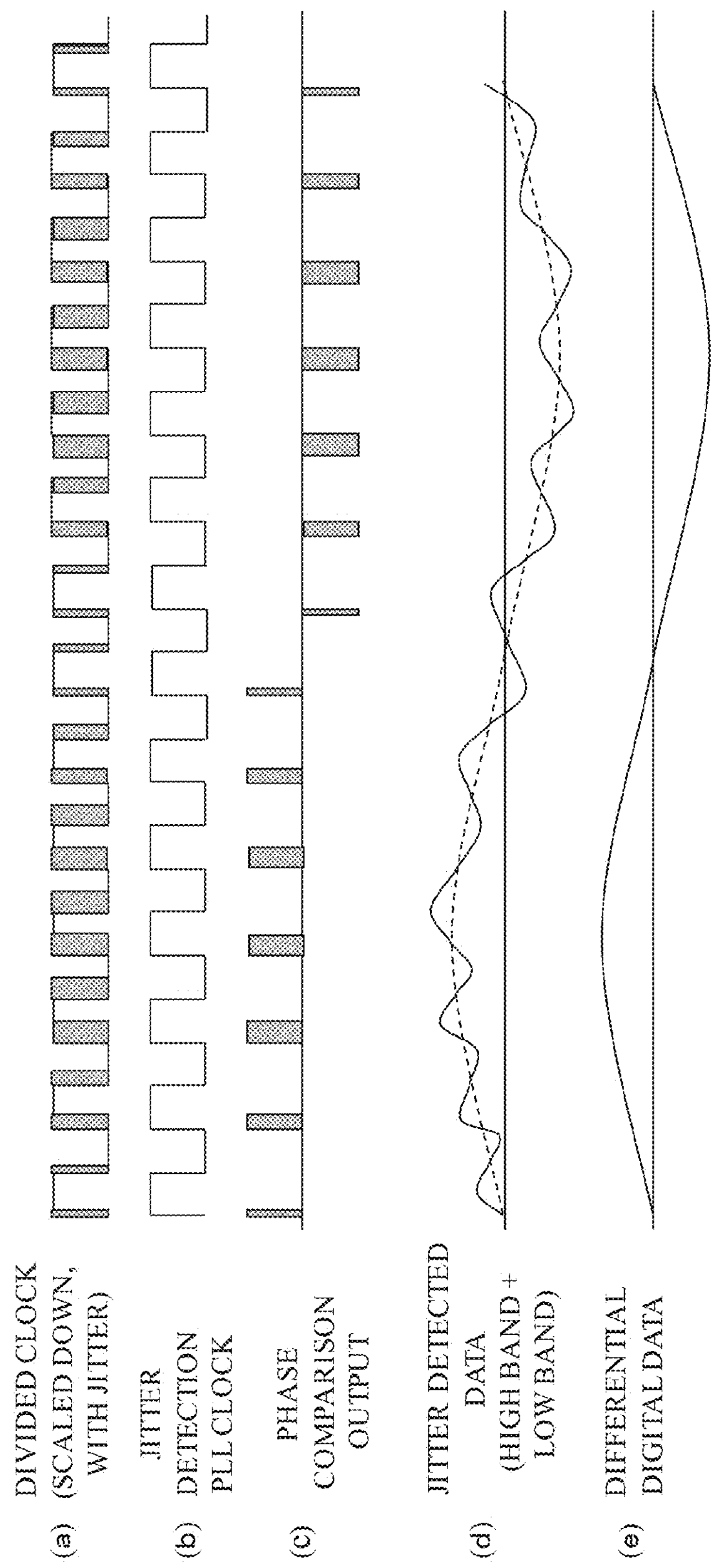
FIG. 5 is a timing diagram showing waveforms at various points in the eye pattern data generator of FIG. 3.

Next, the generation of the differential digital data will be described with additional reference to FIG. 5. Jitter detector circuit 308 has an input terminal for receiving the divided clock (shown again in FIG. 5(*a*)) from the clock extractor/divider circuit 302. More specifically, jitter detector circuit 308, which is a conventionally known circuit, may for example, comprise a PLL circuit, a jitter detection analog circuit section, and an AD converter. Jitter detector circuit 308 is configured to detect jitter contained in the divided clock and generates a resulting jitter detection output. FIG. 5 shows jitter, not shown in FIG. 4(*c*) or 4(*d*), with hatchings. In greater detail, the PLL circuit has a function of detecting timing jitter in a frequency band of 10 Hz or higher. In this PLL circuit, the received divided clock, and a clock output from a VCXO disposed in the PLL circuit or a divider at a later stage are applied to a phase comparator to create a phase comparator output, which is the result of comparing the two clocks in phase. This phase comparator output is passed through a loop filter (set for timing jitter measurement), and the resulting signal is applied to the VCXO. Then, the phase comparator output included in the PLL circuit is subjected to filtering and amplification in the jitter detection analog circuit section to generate jitter detection analog data. This jitter detection analog data is converted to a digital signal by the AD converter, and the digital signal is sent to the following low-pass filter 310 as jitter detection data (FIG. 5(*d*)). It should be noted that while FIG. 5(*d*) shows jitter detection data as a waveform that includes low-band components (indicated by a dotted line) and high-band components (indicated by a solid line) superimposed on the low-band components, the high-band components show alignment jitter in a frequency band of 100 kHz or higher.

Next, low-pass filter 310 has an input terminal for receiving the jitter detection data (FIG. 5(*d*)). Specifically, the low-pass filter 310 may comprise FPGA, by way of example, and cuts off high-band components of 100 kHz or higher, which is a frequency band of alignment jitter, and outputs the result as differential digital data (FIG. 5(*e*)).

Describing next generation of eye pattern data T, the combiner circuit 312 has an input terminal for receiving eye pattern data A from the sampling circuit 306, and an input terminal for receiving the differential digital data from the low-pass filter 310, respectively. Specifically, the combiner circuit 312 may comprise FPGA, by way of example, and combines eye pattern data A with the differential digital data to generate eye pattern data T at its output terminal.

Figure 6:
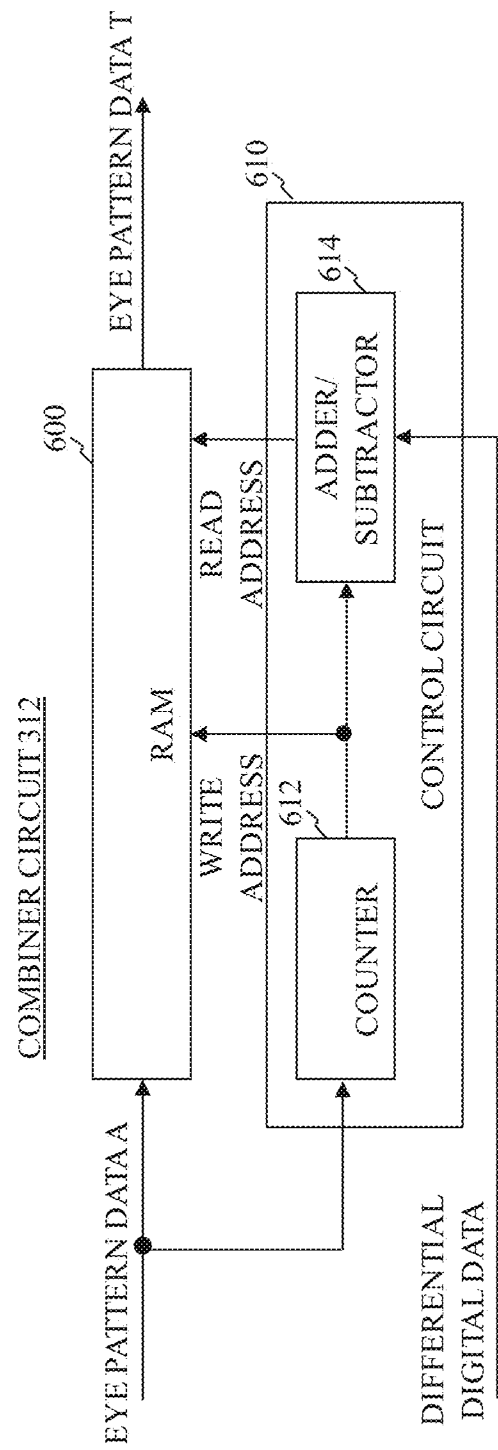
FIG. 6 is a block diagram showing details of a combiner circuit shown in FIG. 3.

Here, referring to a block diagram of FIG. 6 and a timing diagram of FIG. 7, the combiner circuit 312 will be described in detail. As shown in FIG. 6, the combiner circuit 312 comprises a random access memory (RAM) 600, and a control circuit 610 for controlling a write into and a read from the memory 600. More specifically, the RAM 600 has an input terminal for receiving eye pattern data A, and delivers eye pattern data T at its output terminal. The control circuit 610 has an input terminal for receiving eye pattern data A, and an input terminal for receiving the differential digital data (see FIG. 7(*b*)), and also has an output terminal for generating a write address (see a dotted line in FIG. 7(*a*)) for a write into the RAM 600, and an output terminal for generating a read address (see a solid line in FIG. 7(*a*)) for a read from the RAM 600. It is noted that RAM 600 may be disposed within a circuit portion responsible for display processing in a display device such as a waveform monitor for displaying eye patterns.

More specifically, according to one embodiment, control circuit 610 comprises a counter 612 and an adder/subtractor 614. The counter 612 receives eye pattern data A at its input terminal, and outputs the result of counting this data as a write address. The adder/subtractor 614 has two input terminals for receiving the write address and differential digital data, respectively, adds the differential digital data to the received write address, and delivers the result as a read address.

Figure 7:
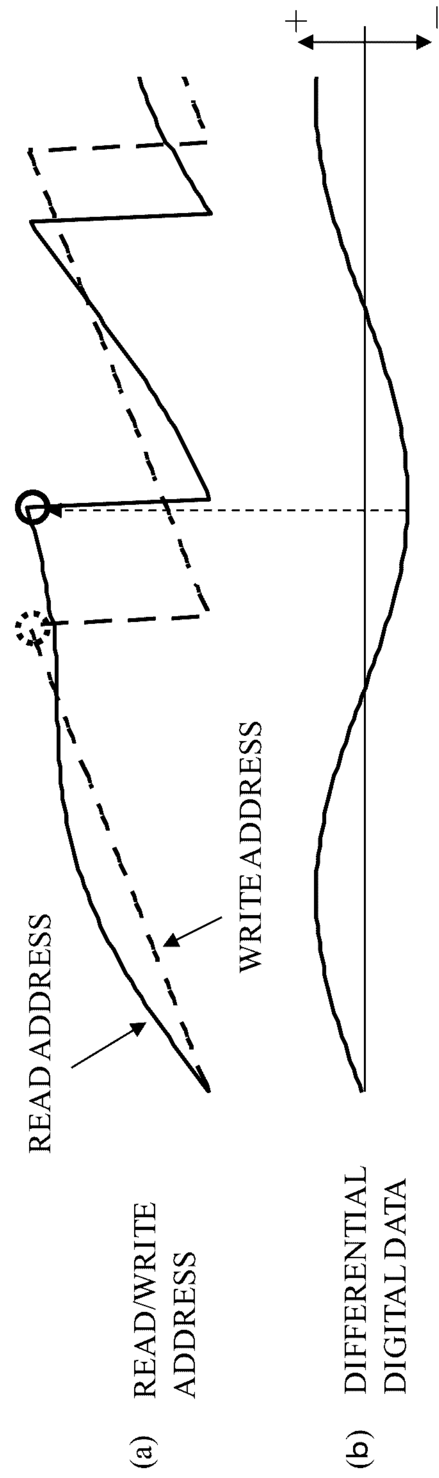
FIG. 7 is a timing diagram showing a relationship among a write address, a read address, and differential digital data generated in the combiner circuit of FIG. 6.

As can be seen from FIG. 7 which is a timing diagram showing the operation of the circuit of FIG. 6, counter 612 counts up as it receives eye pattern data A, and returns to zero after it reaches a maximum value, thereby repeatedly specifying from address 0 to address M corresponding to its maximum value to write eye pattern data A into the RAM 600. Here, the RAM 600 has an address range similar to the maximum value of the counter 612, and a data width corresponding to the bit width of eye pattern data A. It should be noted that a static RAM (SRAM), for example, may be employed for the RAM 600 because read addresses, later described, are not necessarily continuous values. While the SRAM may be, for example, an externally mounted SRAM, FPGA may be employed instead.

The adder/subtractor 614, on the other hand, adds the differential digital data to the write address to increase the write address when the differential digital data is positive, and to decrease the write address when the differential digital data is negative, to form a read address. Since jitter in an eye pattern comprises fluctuations in the horizontal direction or the direction of the time axis, the order of reading eye pattern data A can be changed with the differential digital data through adjustments of the read address, thereby making it possible to add jitter components contained in the differential digital data to jitter components contained in eye pattern data A. More specifically, since the write address matches with the read address when the differential digital data is zero, data accumulated in the RAM is output in the order in which the data was written into the RAM, with the result that delivered eye pattern data T is the same as eye pattern data A. However, if the differential digital data is fluctuating, for example, the jitter is found on the negative side, data stored in a write address (for example, data indicated by a broken-line circle) is read at a later time than the time at which it was actually sampled (as indicated by a solid-line circle). In this way, eye pattern data T read from the RAM 600 can be used to display the timing jitter.

Figure 8:
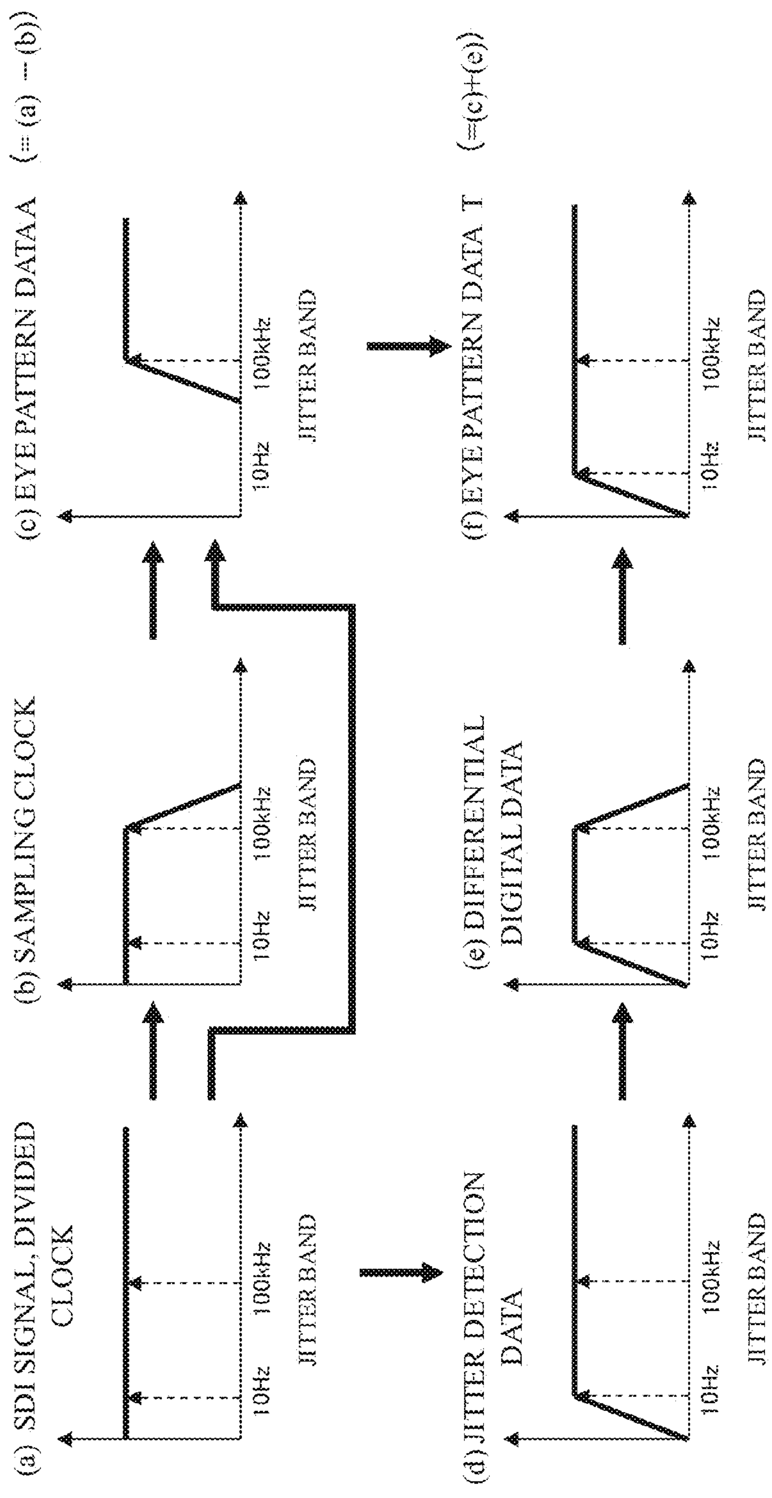
FIG. 8 is a frequency band diagram describing the operation of the eye pattern data generator of FIG. 3 from an aspect of frequency band.

Referring now to FIG. 8, the operation of eye pattern data generator 300 of FIG. 3 will be described again from an aspect of frequency band. First, a frequency band shown in FIG. 8(*a*) is the frequency band of jitter contained in the SDI signal, which is the input, and in a divided clock which is the output of the clock extractor/divider circuit 302. FIG. 8(*b*) shows a frequency band for the sampling clock output by the PLL circuit 304, where frequencies equal to or higher than 100 kHz are cut off, as described above. FIG. 8(*c*) shows a frequency band of jitter in eye pattern data A, which extends the band of FIG. 8(*a*) except for the band of FIG. 8(*b*), i.e., the frequency band for alignment jitter. Next, FIG. 8(*d*) shows a frequency band for the jitter detection output of the jitter detector circuit 308, which corresponds to the frequency band for timing jitter. Next, FIG. 8(*e*) shows a frequency band for the differential digital data output from the low-pass filter 310, which corresponds to a band in which a frequency band of 100 kHz or higher is cut off, i.e., the difference between the alignment jitter and the timing jitter. Next, FIG. 8(*f*) shows a frequency band for eye pattern data T output from the combiner circuit 312, which is a combined band of that shown in FIG. 8(*c*) with that shown in FIG. 8(*e*). In the foregoing manner, eye pattern data generator 300 can generate eye pattern data A for displaying the alignment jitter, and eye pattern data T for displaying the timing jitter.

Eye pattern data A and eye pattern data T generated in the foregoing manner can be simultaneously displayed on the screen of a waveform monitor (not shown), just as before. In addition, eye pattern data A can be applied to a conventional circuit (not shown) for automatically measuring the quality of eye pattern waveform to calculate a variety of parameters indicative of the waveform quality. Such parameters may include amplitude (Amp), rising time (Tr), falling time (Tf), rising edge overshoot (Or), falling edge overshoot (Of), and so on.

Figure 9:
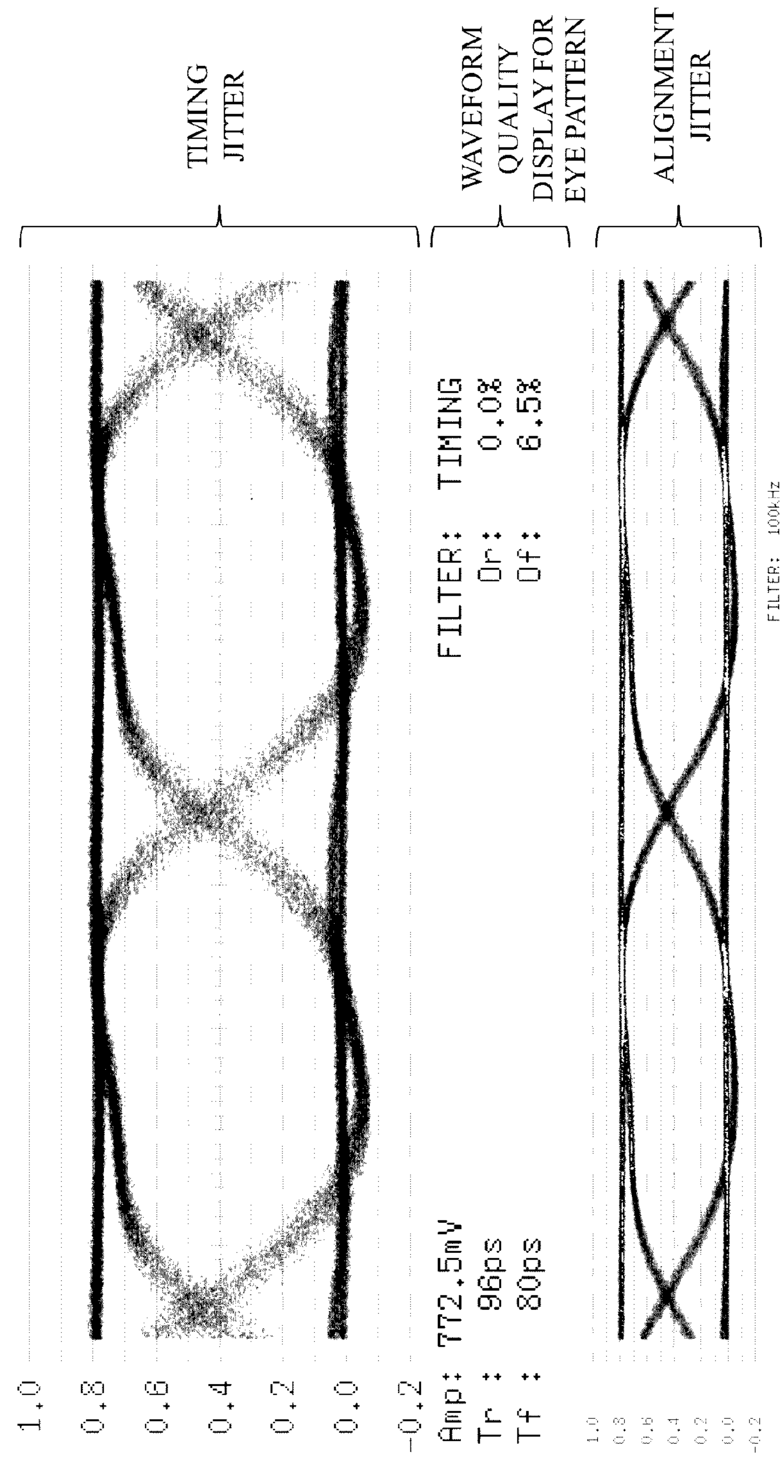
FIG. 9 shows an exemplary eye pattern displayed on a waveform monitor using eye pattern data A and eye pattern data T generated by the eye pattern data generator of FIG. 3.

FIG. 9 shows an example display on a waveform monitor using eye pattern data A and eye pattern data T generated by eye pattern data generator 300 of FIG. 3. Specifically, FIG. 9 shows, from above, an eye pattern for timing jitter, a waveform quality display for this eye pattern, and an eye pattern for alignment jitter.

Figure 10:
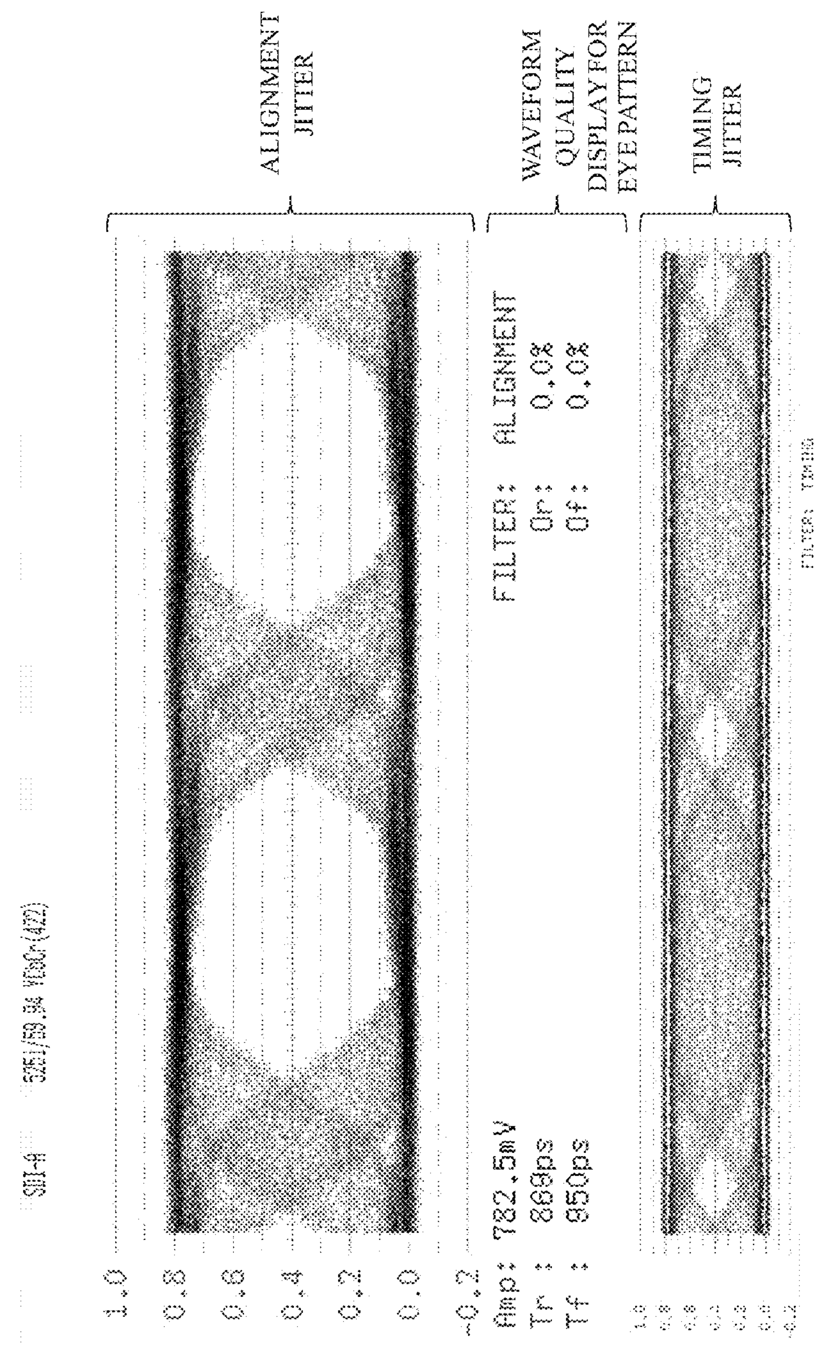
FIG. 10 shows another exemplary eye pattern displayed by a waveform monitor using eye pattern data A and eye pattern data T generated by the eye pattern data generator of FIG. 3.

Likewise, FIG. 10 shows another exemplary display on a waveform monitor using eye pattern data A and eye pattern data T, showing, from above, an eye pattern for alignment jitter, a waveform quality display for this eye pattern, and an eye pattern for timing jitter.

As described above, according to the embodiment, eye patterns can be displayed simultaneously for alignment jitter and timing jitter. Thus, the user can make a test, adjustment and the like for a product which outputs an SDI signal while observing both these eye patterns.

As will be understood by those skilled in the art, a variety of modifications may be made to the embodiment described above. For example, while the foregoing embodiment is intended for jitter defined in Standard SMPTE 292-1, the embodiment similarly can be applied to jitter defined in other standards, for example, SMPTE259M, SMPTE424M, and standards other than television systems. In that case, settings for the PLL circuit, such as input/output frequencies, loop band, and the like, a cut-off frequency of the low-pass filter, and the like may be changed as appropriate in accordance with particular standards.

Further, other modified embodiments are possible, as shown in FIGS. 11-14.

Figure 11:
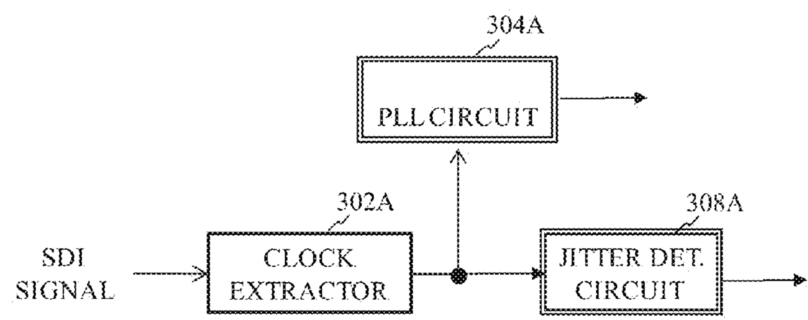
FIG. 11 is a block diagram showing a modified embodiment of a circuit portion included in the eye pattern data generator of FIG. 3.

Specifically, FIG. 11 shows a modified embodiment of a circuit portion including clock extractor/divider circuit 302, PLL circuit 304, and jitter detector circuit 308 in FIG. 3. In this example of FIG. 11, a clock extractor circuit portion is separated from clock extractor/divider circuit 302 in FIG. 3 to provide a clock extractor circuit 302A, and the remaining divider circuit portion is provided in each of PLL circuit 304 and jitter detector circuit 308, resulting in a PLL circuit 304A and a jitter detector circuit 308A.

Figure 12:
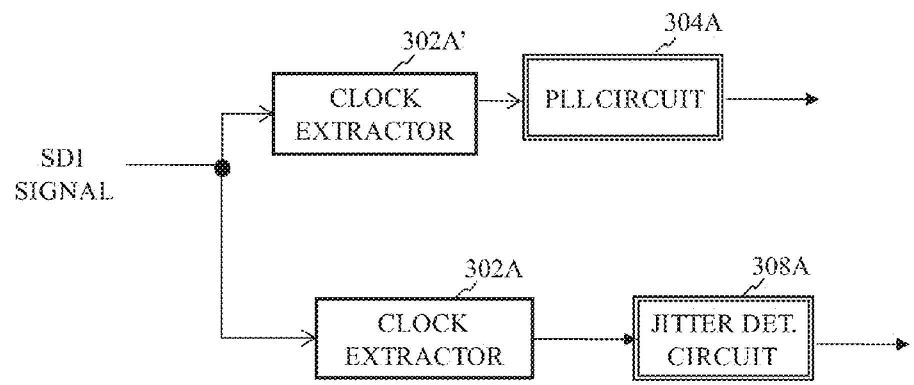
FIG. 12 is a block diagram showing a modified embodiment of the circuit portion included in the eye pattern data generator of FIG. 3.

FIG. 12 shows addition of clock extractor circuit 302A' to the circuit in FIG. 11 on the input side of PLL circuit 304A.

Figure 13:
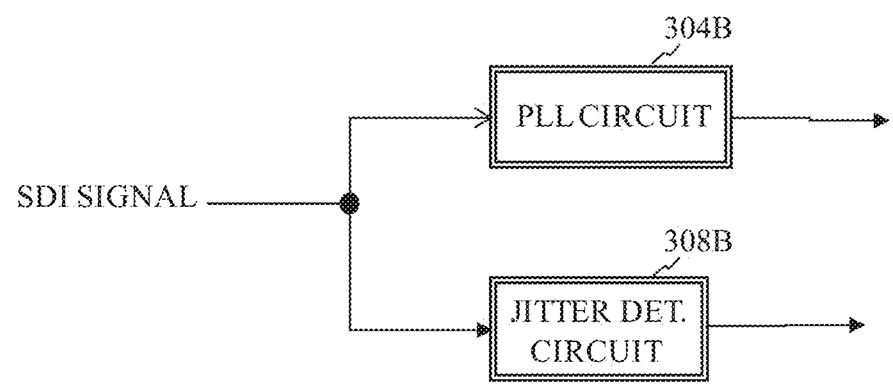
FIG. 13 is a block diagram showing a modified embodiment of the circuit portion included in the eye pattern data generator of FIG. 3.

FIG. 13 shows a PLL circuit 304B and a jitter detector circuit 308B, which comprise a clock extractor/divider circuit in PLL circuit 304 and jitter detector circuit 308, respectively.

Figure 14:
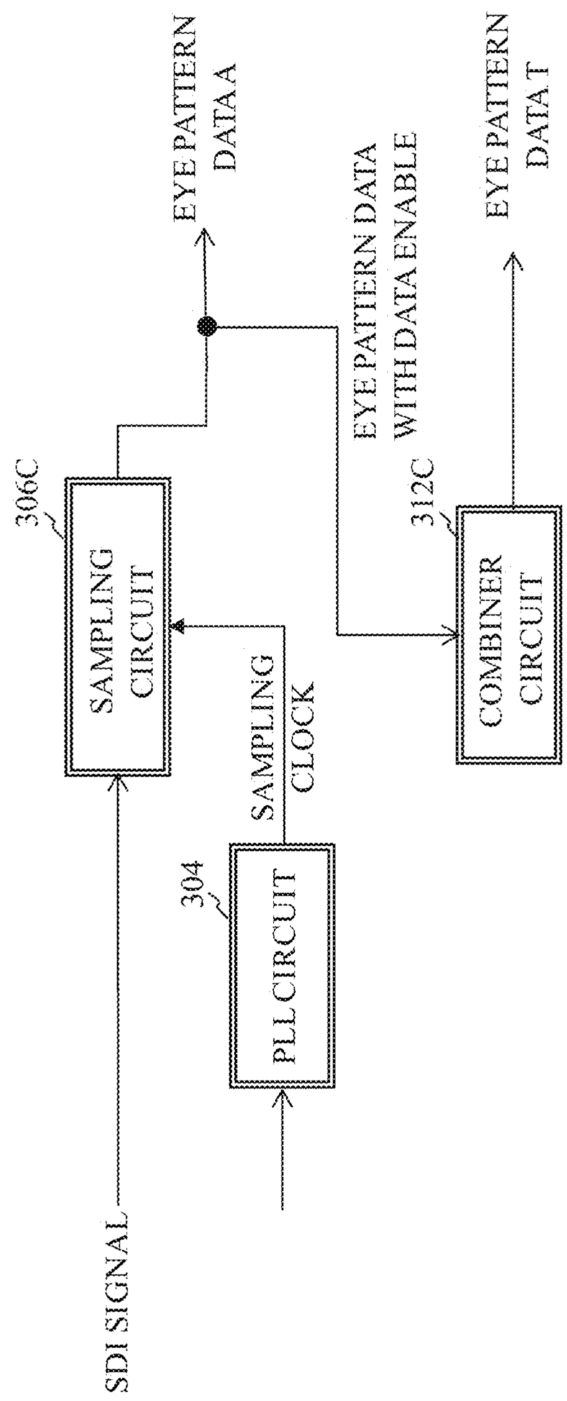
FIG. 14 is a block diagram showing a modified embodiment of the circuit portion included in the eye pattern data generator of FIG. 3 or the circuit portion of FIGS. 11-13.

FIG. 14 shows an embodiment modified from that of FIG. 3 such that combiner circuit 312 is supplied only with an output of the sampling circuit 306, and is not supplied with a sampling clock output from PLL circuit 304. Specifically, a sampling circuit 306C converts a sampling clock received from the PLL circuit 304 to a data enable signal, and adds the data enable signal to eye pattern data A, which is to be output. A combiner circuit 312C, which receives eye pattern data A accompanied by the data enable signal, detects the data enable signal within the received data, and recovers a sampling clock similar to that of FIG. 3. Accordingly, the sampling clock of PLL circuit 304 need not necessarily be supplied to the combiner circuit. The modification of FIG. 14 similarly can be applied to the modified embodiments of FIGS. 11-13.

Furthermore, the circuit of FIG. 6 can be used not only to combine different jitter frequency components, but also to combine other frequency components. In that case, the circuit may receive first digital data including frequency components in a first frequency band as eye pattern data A, receive second digital data including frequency components in a second frequency band as differential jitter data, and deliver third digital data including frequency components in the first and second frequency bands as eye pattern data T. Also, in some cases, the circuit can be extended not only to simultaneously generate two jitter-associated data, but also to generate simultaneously three or more jitter-associated data.

While various exemplary aspects and embodiments have been discussed above, those skilled in the art will recognize certain modifications, permutations, additions and sub-combinations thereof. It is therefore intended that the following appended claims and claims hereafter introduced are interpreted to include all such modifications, permutations, additions and sub-combinations as are within the true scope.

What is claimed is:

1. A generator circuit for generating digital outputs associated with first jitter and second jitter, said generator circuit comprising:
- a first circuit that receives a digital input and generates a first digital output associated with the first jitter from the digital input, said first digital output including frequency components in a first frequency band common to the first and second jitter;
- a second circuit that receives the digital input, and generates a second digital output from the digital input, said second digital output including frequency components in a second frequency band corresponding to the difference between the first and second jitter; and
- a third circuit that generates a third digital output associated with the second jitter from the first digital output and the second digital output, said third digital output including frequency components in a third frequency band, said third frequency band including the first and second frequency bands.

2. A generator circuit according to claim 1, wherein:
- said first circuit includes a sampling circuit; and
- said second circuit includes a jitter detector circuit.

3. A generator circuit according to claim 2, wherein said third circuit includes:
- a memory; and
- a control circuit that controls a write and a read of the first digital output into and from said memory based on timing information associated with the first digital output and the second digital output.

4. A generator circuit according to claim 3, wherein said control circuit includes:
- a write address generator circuit that generates, from timing information associated with the first digital output, a write address for writing the first digital output into said memory; and
- a read address generator circuit that generates, from the write address and the second digital output, a read address for reading the first digital output from said memory.

5. A generator circuit according to claim 1, wherein:
- said digital input is a serial digital interface (SDI) signal;
- said first jitter is alignment jitter of the SDI signal;
- said second jitter is timing jitter of the SDI signal;
- said first digital output is used to generate a first eye pattern for indicating the alignment jitter; and
- said third digital output is used to generate a second eye pattern for indicting the timing jitter.

6. A combiner circuit for combining frequency components in two frequency bands, comprising:
- a memory;
- a write address generator circuit that generates, from timing information associated with a first digital data, a write address for writing the first digital data including frequency components in a first frequency band into said memory; and
- a read address generator circuit that generates, from a second digital data including frequency components in a second frequency band and the write address, a read address for reading the first digital data from said memory, said digital data read from said memory including frequency components in a third frequency band, said third frequency band including frequency components in the first and second frequency bands.

7. A combiner circuit according to claim 6, wherein:
- said frequency components in the first and second frequency bands are jitter frequency components.

8. A combiner circuit according to claim 6, wherein:
- said first and second digital data relate to a serial digital interface (SDI) signal;
- said frequency components in the first frequency band are associated with alignment jitter of the SDI signal; and
- said frequency components in the third frequency band are associated with timing jitter of the SDI signal.

* * * * *